United States Patent [19]
Prasse et al.

[11] Patent Number: 4,939,475
[45] Date of Patent: Jul. 3, 1990

[54] CIRCUIT ARRANGEMENT COMPRISING AN AMPLIFIER CONNECTED TO AN OPTO-ELECTRICAL TRANSDUCER

[75] Inventors: Karl-Heinz Prasse, Mittenwald, Fed. Rep. of Germany; Hermann Danzer, Weidling, Austria

[73] Assignee: Siemens Aktiengesellschaft, Berlin and Munich, Fed. Rep. of Germany

[21] Appl. No.: 407,885

[22] Filed: Sep. 15, 1989

[30] Foreign Application Priority Data

Sep. 15, 1988 [EP] European Pat. Off. ........ 88115132.8

[51] Int. Cl.$^5$ .............................................. H03G 3/30
[52] U.S. Cl. ................................. 330/59; 250/214 A; 330/308
[58] Field of Search ............. 330/59, 308; 250/214 A, 250/214 AG; 455/619

[56] References Cited

U.S. PATENT DOCUMENTS 3,631,262 12/1971 Jarrett .................................. 307/229
4,124,825 11/1978 Webb et al. ...................... 330/308 X

FOREIGN PATENT DOCUMENTS 0102174 3/1984 European Pat. Off. .
0181146 5/1986 European Pat. Off. .
3204839 9/1983 Fed. Rep. of Germany .
2105543 3/1983 United Kingdom .

OTHER PUBLICATIONS

Williams, G. F. et al., "Active Feedback Lightwave Receivers," Journal of Lightwave Technology, vol. LT-4, No. 10, Oct. 1986, pp. 1502-1508.

Primary Examiner—James B. Mullins
Attorney, Agent, or Firm—Hill, Van Santen, Steadman & Simpson

[57] ABSTRACT

A circuit arrangement comprises an amplifier that has an input connected to an opto-electrical transducer and a gain which is controllable with the assistance of a control voltage. In order to achieve a great dynamic range given a constant operating point of the amplifier, the drain-source path of a field effect transistor, a feedback path includes a capacitor, and the input of the amplifier is connected to the output of a comparator that compares the output voltage of the amplifier to a reference voltage. The circuit arrangement can be advantageously employed in optical transmission equipment of PCM technology.

4 Claims, 1 Drawing Sheet

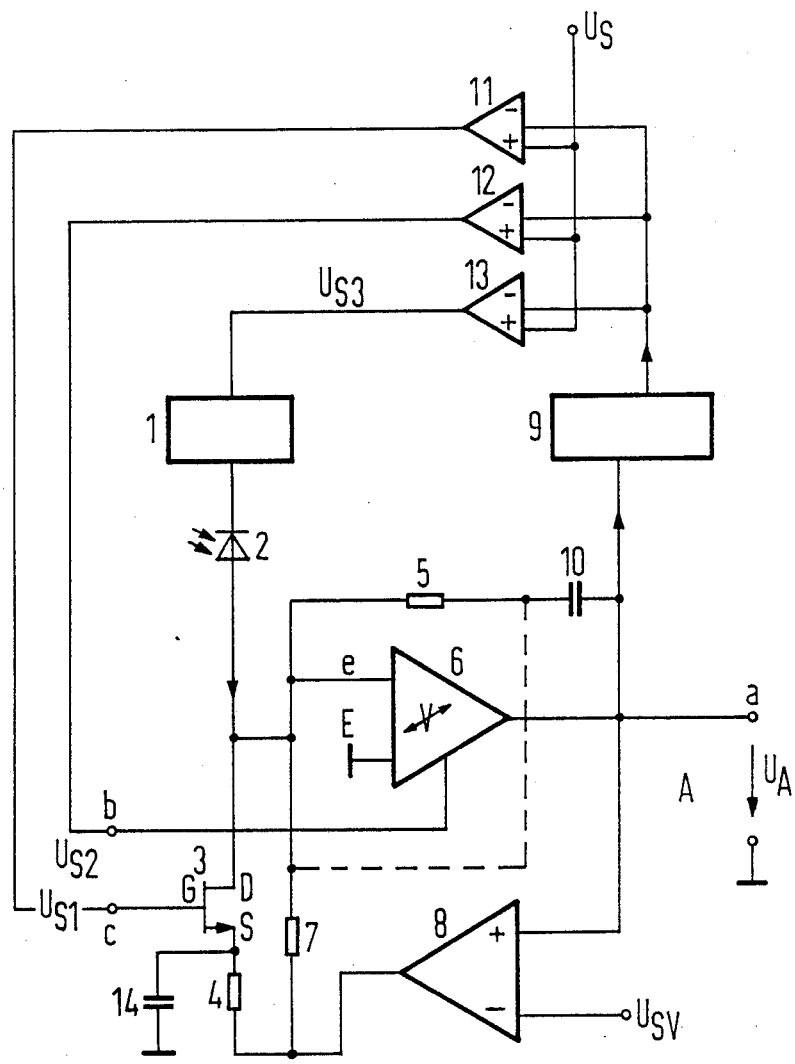

CIRCUIT ARRANGEMENT COMPRISING AN AMPLIFIER CONNECTED TO AN OPTO-ELECTRICAL TRANSDUCER

BACKGROUND OF THE INVENTION

1. Field of the Invention:

The present invention relates to a circuit arrangement comprising an amplifier, particularly a transimpedance amplifier, connected to an opto-electrical transducer, in which the gain of the amplifier is controllable with the assistance of a control element that modifies the load resistance of the amplifier.

2. Description of the Prior Art

A circuit arrangement of the general type set forth above is disclosed in German patent 32 04 839. This known circuit arrangement has a photo diode at the input and contains an iterative circuit composed of an emitter feedback branch between the output of the collector stage and the input of the emitter stage. The circuit arrangement composed of two stages forms what is referred to as a transimpedance amplifier that has a comparatively low input resistance and a comparatively extremely low output resistance. The drain-source path of a field effective transistor is connected in parallel to the collector resistor of the emitter stage, the resistance of the field effect transistor being continuously controllable with the assistance of a control voltage. The effective collector resistance can be varied within broad limits in this manner. A possibility of an external setting of the gain of the first amplifier stage within a relatively great dynamic range therefore derives. However, the d.c. operating point of the amplifier arrangement is thereby influenced by the gain control.

The known circuit arrangement should also comprise the standard requirements made in view of noise-optimized out-coupling of the electrical signals output by the photo receiver, of high gain and low power consumption, together with an optimally-low set noise.

SUMMARY OF THE INVENTION

It is the object of the present invention to provide a circuit arrangement of the type generally set forth above with which variable values of the amplifier noise factor and frequency response of the amplifier derive within a great dynamic range of amplification. In particular, the limit frequency of the amplification should, insofar as possible, not decrease given a control of the gain toward lower values.

According to the invention, the circuit arrangement for achieving the object set forth above comprises an amplifier having its input connected to an opto-electrical transducer, the gain of the amplifier being controllable with the assistance of a control element that modifies the load resistance of the amplifier, a feedback branch arranged between the signal output of the amplifier and the signal input of the amplifier, the source-drain path of the field effect transistor is connected parallel to the signal input of the amplifier, and the feedback branch is connected via a capacitor, and the output of a comparator that has an input for the output d.c. voltage of the amplifier and an input for a reference voltage is connected to the input of the amplifier. This structure provides that the gain control does not influence the d.c. operating point of the amplifier.

The features of the invention yield the advantage that the measures provided for controlling the gain effect practically no deterioration of the amplifier noise factor or of the frequency response of the amplification when the circuit arrangement is set to maximum amplification.

According to a particular feature of the invention, a respective resistor is arranged between the output of the comparator and the input of the amplifier and between the output of the comparator and the source electrode of the field effect transistor.

According to another feature of the invention, the feedback branch is formed by a RC series circuit.

According to another feature of the invention, the resistor connected between the output of the comparator and the input of the amplifier is connected to the input of the amplifier via the resistor of the RC series circuit.

The provision of the resistor between the output of the comparator and the input of the amplifier provides the advantage that the load resistance of the field effect transistor can be set in a simple manner with the assistance of a control voltage.

The feedback resistance is decoupled by the series-arranged capacitor for direct current.

BRIEF DESCRIPTION OF THE DRAWINGS

Other objects, features and advantages of the invention, its organization, construction and operation will be best understood from the following detailed description taken in conjunction with the accompanying drawing on which there is a single figure showing a circuit arrangement comprising an amplifier connected to an opto-electrical transducer, the amplifier being controllable with respect to gain.

DESCRIPTION OF THE PREFERRED EMBODIMENTS

Referring to the drawing, an amplifier 6 is connected to a photodiode, in particular an avalanche photodiode. The circuit arrangement provides that the amplifier 6 that comprises as asymmetrical signal input E and an asymmetrical signal output A. The terminal e of the signal input E is connected to the anode of the photodiode 2. The terminal a of the output A carrying voltage to reference potential is connected to the terminal e of the signal input E via a capacitor 10 and a resistor 5 connected in series therewith.

Furthermore, the actual value input "+" of a comparator 8 is connected to the terminal a of the signal output A. The reference voltage $U_{sv}$ is connected to the reference input "−" of the comparator 8. The output of the comparator 8 is connected to the terminal e of the signal input E via a resistor 7. The other terminal of the resistor 7 can be connected, as warranted, to the junction of the resistor 5 with the capacitor 10 instead of being connected to the input e. The series circuit of the resistor 4 and the source-drain path of a field effect transistor 3 is connected in parallel to the input E.

A peak value rectifier 9 is connected to the terminal a of the signal output A. Three controlled-gain amplifiers 11, 12 and 13 each have their actual value input "−" connected to the output of the peak rectifier 9. The reference values inputs "+" of the controlled-gain amplifiers 11, 12 and 13 are connected in common to a bias voltage $U_s$, so that the ranges of control of the amplifiers 11, 12 and 13 at least partially overlap. As warranted, the controlled-gain amplifier can each be provided with a separate bias voltage source. A bias voltage generator 1 is connected to the controlled-gain amplifier 13. The cathode of the photodiode 2 is connected to its output. The bias voltage generator 1 is a controlled d.c.-to-d.c. converter that supplies a comparatively high bias voltage for the photo diode 2. The controlled-gain amplifier 13 sees to it that the bias voltage is controlled in a desired manner. The gain of the amplifier 6 can be controlled with the assistance of the control voltage $U_{s2}$. The control electrode of the field effect transistor 3 is connected to a terminal c for receiving a control voltage $U_{s1}$. The source electrode of the field effect transistor 3 is connected to ground with respect to alternating voltage via a capacitor 14.

The circuit arrangement of the drawing allows the gain to be continuously controlled within a broad range. The operating point thereby remains advantageously constant.

The amplifier 6 is an amplifier comprising an amplifier stage with controllable gain. For controlling the gain, the load resistor of the amplifier stage and, therefore, the gain is varied. German patent 32 04 839 discloses this type of gain variation. The variation of the load resistor can be undertaken with a field effect transistor or with the assistance of PIN diodes whose value of resistance is controlled by the control voltage $U_{s2}$. As warranted, the gain control can be undertaken in that the steepness of a transistor operated in emitter circuitry is employed, the base thereof forming the terminal e of the amplifier 6.

The fact that the full current I must flow through the feedback resistor given increasing input current I is advantageously prevented in the circuit arrangement of the drawing. This current is diverted via the field effect transistor 3 that is connected parallel to the input of the amplifier 6. The utilization of the field effect transistor 3 having low capacitance as well as the off-state resistance of standard field effect transistors that lies in the megohm range assures that, when the maximum gain is set, the measures that enable a reduction of the gain do not effect a significant deterioration of the noise factor and of the frequency response of the circuit arrangement.

A further control circuit sees to it that the operating point of the circuit arrangement remains constant, i.e. that the gain control does not influence the d.c. operating point of the amplifier arrangement. To this end, the feedback resistor 5 is decoupled with respect to direct current by the capacitor 10.

The output d.c. voltage of the amplifier 6 is compared to a reference value $U_{vs}$ with the assistance of a comparator 8. The bias voltage at the signal input E is modified with the assistance of the comparator 8 until the reference value and the actual value coincide with one another. The operating point of the amplifier 6 is kept constant in this manner given changing input currents I.

In a departure from the circuit of the drawing, the output of the comparator 8 can be directly connected to the terminal e. In combination with the resistor 4, however, the resistor 7 has the advantage that the current I is divided in such fashion between the resistor 7 and the field effect transistor 3 that the field effect transistor 3 always remains in resistor operation and that, moreover, the voltage at the source electrode of the field effect transistor 3 is kept constant. As a result of the control voltage of the source electrode, a simple control of the resistance $R_{ds}$ of the field effect transistor is possible with the gate-source voltage $U_{gs}$, i.e. with the control voltage $U_{s1}$.

The gain control can be calculated in a simple manner as follows, whereby:

UA is the output voltage;
$R_k$ is the value of the resistor 5;
$V_o$ is the gain of the open amplifier;
$R_{ds}$ is the resistance of the drain-source path of the field effect transistor 3;
$R_{on}$ is the resistance of the source-drain path of the field effect transistor 3 in the conductive condition;
v is the limit frequency of the open amplifier 6; and
gb is the limit frequency formed by the input circuit.

$$\frac{U_a}{I} = -R_K \frac{1}{1 + \frac{1}{v_o}\left(\frac{R_K}{R_{DS}} + 1\right)}$$

The maximum gain derives at:

$$\left(\frac{U_a}{I}\right)_{max} = R_k$$

where $R_{ds}$ strives toward

When $R_{ds}$ strives toward $R_{on}$, then the maximum gain with $V_0 = 1$ occurs at $$\left(\frac{U_a}{I}\right)_{min} = R_{ON}$$

The following apply in an example of preferred dimensioning;
$R_k = 10$ k;
$R_{on} = 10$ $R_k/R_{on} = 1000 = 3$ decades.

For example, a gain control over three decades can be realized in this manner.

When the limit frequence $\infty_v$ of the unconnected amplifier is selected such that it lies higher than the limit frequency $\infty_{gp}$ formed by the circuit input, i.e. the input capacitance and input resistance, then it is not only no reduction but even an increase of this limit frequency that advantageously occurs given a control of the gain toward lower values.

With the condition that the unconnected amplifier 6 is a low-pass filter of the first order having the limit frequency $\infty_v$, the frequency response of the unconnected amplifier 6 is calculated in the following manner dependent on the resistance $R_{ds}$:

$$\frac{U_A}{I} = -\frac{R_K}{1 + \frac{v^1}{v_0}} \frac{1}{1 + j\frac{\omega}{\omega_v\left(1 + \frac{v}{v^1}\right)}} \text{ with }$$

$$v^1 = \frac{R_k}{R_{DS}} + 1$$

$$\omega_g = \omega_v\left(1 + \frac{v_0}{v^1}\right)$$

When $R_{fet}$ strives toward $\pi$, then the field effect transistor 3 acts as a current source and $\omega_v = \omega_v(1+V_o) > \omega_{gp}$ applies.

When $R_{fet}$ strives toward 0, then the field effect transistor 3 acts as a voltage source and $\omega_g = \omega_v$.

Although we have described our invention by reference to particularl illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A circuit arrangement comprising:
   an amplifier including an input and an output and having a gain which is controllable with the assistance of a control element that modifies its load resistance;
   an opto-electrical transducer connected to said input;
   a feedback circuit, including a capacitor, connected between said output and said input;
   a field effect transistor including a drain, a source, and a gate, and a drain-source path connected in parallel with said input of said amplifier; and
   a comparator including a first input connected to said output of said amplifier, a second input connected to a reference potential, and an output connected to said input of said amplifier.

2. The circuit arrangement of claim 1, and further comprising:
   a first resistor connected between said output of said comparator and said input of said amplifier; and
   a second resistor connected between said output of said comparator and said source of said field effect transistor.

3. The circuit arrangement of claim 2, wherein:
   said feedback circuit comprises a series circuit including said capacitor and a third resistor.

4. The circuit arrangement of claim 3, wherein:
   said first resistor is connected to said input of said amplifier via said third resistor of said feedback circuit.

* * * * *